(12) United States Patent
Kwon et al.

(10) Patent No.: US 8,854,779 B2
(45) Date of Patent: Oct. 7, 2014

(54) INTEGRATED CIRCUIT

(75) Inventors: Igsoo Kwon, San Jose, CA (US);
Bokmoon Kang, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 57 days.

(21) Appl. No.: 13/591,879

(22) Filed: Aug. 22, 2012

(65) Prior Publication Data
US 2014/0055891 A1    Feb. 27, 2014

(51) Int. Cl.
*H02H 3/22*    (2006.01)
(52) U.S. Cl.
USPC .............................. 361/56; 361/111
(58) Field of Classification Search
USPC .................................... 361/56, 111
See application file for complete search history.

(56) References Cited

U.S. PATENT DOCUMENTS

| | | | |
|---|---|---|---|
| 4,937,700 A * | 6/1990 | Iwahashi | 361/56 |
| 6,934,204 B2 * | 8/2005 | Itou et al. | 365/201 |
| 2002/0008235 A1 * | 1/2002 | Bette | 257/48 |
| 2002/0175744 A1 * | 11/2002 | Senda et al. | 327/536 |
| 2007/0109016 A1 * | 5/2007 | Loughmiller | 326/38 |
| 2008/0048767 A1 * | 2/2008 | Kobayashi et al. | 327/538 |

* cited by examiner

*Primary Examiner* — Danny Nguyen
(74) *Attorney, Agent, or Firm* — IP & T Group LLP

(57) ABSTRACT

An integrated circuit includes an internal power line, a no-connection (NC) pad, and a switch configured to electrically connect the internal power line with the NC pad to supply a first external voltage to the internal power line through the NC pad in response to a control signal.

10 Claims, 3 Drawing Sheets

INTEGRATED CIRCUIT

BACKGROUND

1. Field

Exemplary embodiments of the present invention relate to an integrated circuit, and more particularly, to an integrated circuit including an NC pad.

2. Description of the Related Art

Diverse integrated circuit chips operate their internal circuits based on an external power supply voltage, which is supplied from the outside. The kinds of internal voltages used in an integrated circuit chip are so diverse that it is difficult to supply all the internal voltages using the external power supply voltage. Therefore, the integrated circuit chip uses an internal voltage generation circuit for generating a voltage whose level is different from that of the power supply voltage in the integrated circuit chip.

Particularly, a charge pump circuit for generating a high voltage that is higher than the voltage level of an external power supply voltage, or a charge pump circuit for generating a negative voltage that is lower than the voltage level of a ground voltage supplied from the outside of the integrated circuit chip is usually used.

FIG. 1 illustrates a conventional integrated circuit chip including a high-voltage pumping circuit 110 and an internal circuit 120 that operates using the high-voltage pumping circuit 110.

Referring to FIG. 1, the high-voltage pumping circuit 110 performs a pumping operation based on a power supply voltage VDD that is applied from the outside of the integrated circuit chip and generates a high voltage VPP which is higher than the power supply voltage VDD. For example, the power supply voltage VDD may be approximately 1.2V and the high voltage VPP may be approximately 4V. The internal circuit 120 operates based on the high voltage VPP generated in the high-voltage pumping circuit 110 and a ground voltage VSS.

Each integrated circuit chip goes through a test operation to figure out its characteristics and whether the integrated circuit chip performs a normal operation or not. When any error is detected in the operation of the internal circuit 120 during the test operation, it may be difficult to determine whether the error is caused by the internal circuit 120 or by the high-voltage pumping circuit 110, e.g., an error in the level of the high voltage VPP. Also, it may be difficult to test the integrated circuit chip by changing the level of the high voltage VPP to figure out the characteristics of the internal circuit 120.

SUMMARY

An embodiment of the present invention is directed to increasing test efficiency of an integrated circuit chip by using an NC pad.

In accordance with an exemplary embodiment of the present invention, an integrated circuit includes an internal power line, a no-connection (NC) pad, and a switch configured to electrically connect the internal power line with the NC pad to supply a first external voltage to the internal power line through the NC pad in response to a control signal.

In accordance with another exemplary embodiment of the present invention, an integrated circuit includes an internal high-voltage supply line, an internal negative-voltage supply line, a first no-connection (NC) pad, a second NC pad, a first switch configured to electrically connect the internal high-voltage supply line with the first NC pad in response to a first control signal, and a second switch configured to electrically connect the internal negative-voltage supply line with the second NC pad in response to a second control signal, wherein the first and second control signals are enabled in a test operation.

In accordance with further embodiment of the present invention, an integrated circuit includes a first power line supplied with a first voltage, a second power line coupled to a no-connection (NC) pad, and a switch configured to supply a second voltage higher or lower than the first voltage to the second power line from the NC pad in response to a control signal enabled in a test operation.

DETAILED DESCRIPTION

Figure 1:
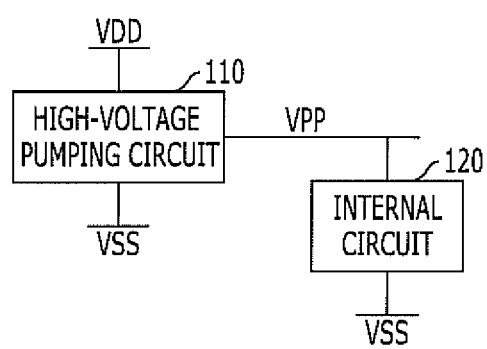
FIG. 1 is a diagram illustrating a conventional integrated circuit chip including a high-voltage pumping circuit and an internal circuit that operates using the high-voltage pumping circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
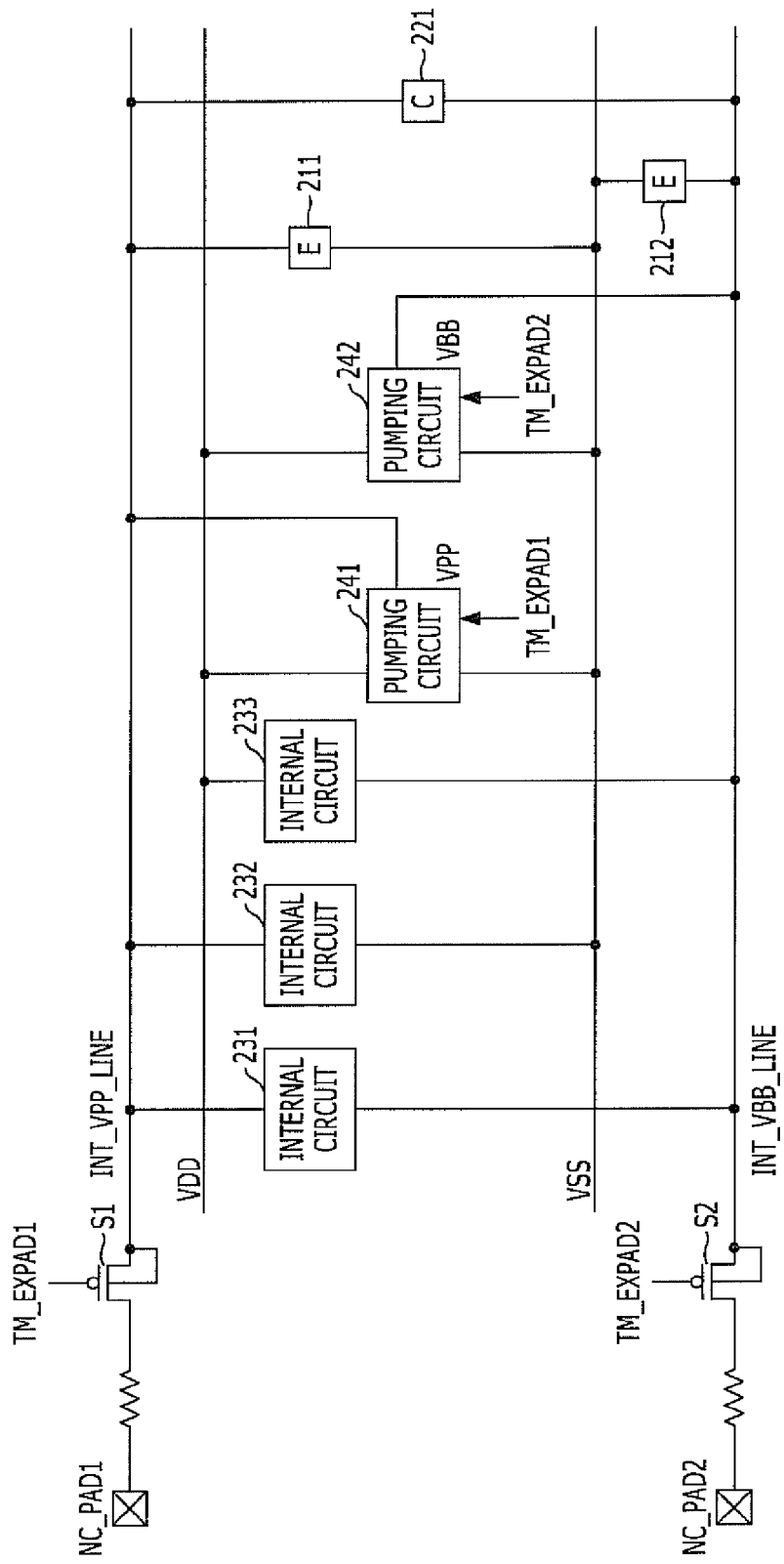
FIG. 2 is a circuit diagram of an integrated circuit chip in accordance with an exemplary embodiment of the present invention.

FIG. 2 is a circuit diagram of an integrated circuit chip in accordance with an exemplary embodiment of the present invention.

Referring to FIG. 2, the integrated circuit chip includes an internal high-voltage supply line INT_VPP_LINE, an internal negative-voltage supply line INT_VBB_LINE, a first no-connection (NC) pad NC_PAD1, a second NC pad NC_PAD2, a first switch S1, a second switch S2, electrostatic discharge (ESD) protection circuits 211 and 212, a clamp circuit 221, internal circuits 231, 232 and 233, and pumping circuits 241 and 242.

The internal high-voltage supply line INT_VPP_LINE is a power line for supplying a high voltage VPP in the integrated circuit chip. The internal negative-voltage supply line INT_VBB_LINE is a power line for supplying a negative voltage VBB in the integrated circuit chip.

The first and second no-connection (NC) pads NC_PAD1 and NC_PAD2 are pads used, for example, only while the integrated circuit chip is tested and they are not used when the integrated circuit chip operates. The first and second NC pads NC_PAD1 and NC_PAD2 over the integrated circuit chip, which is a wafer, may not be coupled with the pins (or balls) of a semiconductor package. Even though the first and second NC pads NC_PAD1 and NC_PAD2 over the integrated circuit chip are coupled with the pins (or balls) of the semiconductor package, it is general that they are not coupled with the lines over the substrate where the semiconductor package is mounted. However, in some semiconductor packages NC pins, which are pins over a package to be connected with the NC pads, may be coupled with a power source voltage VDD or a ground voltage VSS. In this embodiment of the present invention, the first and second NC pads NC_PAD1 and NC_PAD2 are used to supply a voltage from the outside of the integrated circuit chip to power supply lines during a test operation. To be specific, the high voltage VPP, e.g., 4V, is forced to the first NC pad NC_PAD1, and the negative voltage VBB, e.g., −2V, is forced to the second NC pad NC_PAD2 during the test operation.

The first switch S1 electrically connect the first NC pad NC_PAD1 to the internal high-voltage supply line INT_VPP_LINE when a first control signal TM_EXPAD1 is enabled. The first control signal TM_EXPAD1 is enabled when the integrated circuit chip performs a test operation, and it is disabled when the integrated circuit chip performs a normal operation. The first switch S1 is provided to shut off a voltage of a wrong voltage level from being applied from the first NC pad NC_PAD1 to the internal high-voltage supply line INT_VPP_LINE during the normal operation. The first switch S1 may be formed of a PMOS transistor that is turned on in response to the first control signal TM_EXPAD1 enabled to a logic low level. In this case, to perform a stable operation of the PMOS transistor, the voltage of the internal high-voltage supply line INT_VPP_LINE may be applied to the back bias (bulk) of the PMOS transistor. The first switch S1 and the first NC pad NC_PAD1 may be coupled through a resistor R1. Here, the resistor R1 is provided to increase the stability.

The second switch S2 electrically connect the second NC pad NC_PAD2 to the internal negative-voltage supply line INT_VBB_LINE when a second control signal TM_EXPAD2 is enabled. The second control signal TM_EXPAD2 is enabled when the integrated circuit chip performs a test operation, and it is disabled when the integrated circuit chip performs a normal operation. The second switch S2 is provided to shut off a voltage of a wrong voltage level from being applied from the second NC pad NC_PAD2 to the internal negative-voltage supply line INT_VBB_LINE during the normal operation. The second switch S2 may be formed of an NMOS transistor that is turned on in response to the second control signal TM_EXPAD2 enabled to a logic high level. In this case, to perform a stable operation of the NMOS transistor, the voltage of the internal negative-voltage supply line INT_VBB_LINE may be applied to the back bias of the NMOS transistor. The second switch S2 and the second NC pad NC_PAD2 may be coupled through a resistor R2. Here, the resistor R2 is provided to increase the stability.

The ESD protection circuit 211 discharges current from the internal high-voltage supply line INT_VPP_LINE to the ground voltage VSS terminal when the voltage level of the internal high-voltage supply line INT_VPP_LINE is excessively increased. The ESD protection circuit 212 discharges current from the ground voltage VSS terminal to the internal negative-voltage supply line INT_VBB_LINE when the voltage of the ground voltage VSS terminal is excessively increased compared with that of the internal negative-voltage supply line INT_VBB_LINE (in other words, when the voltage of the internal negative-voltage supply line INT_VBB_LINE is excessively decreased). Also, the clamp circuit 221 discharges current from the internal high-voltage supply line INT_VPP_LINE to the internal negative-voltage supply line INT_VBB_LINE when the voltage difference between the internal high-voltage supply line INT_VPP_LINE and the internal negative-voltage supply line INT_VBB_LINE becomes greater than a threshold value.

The internal circuits 231, 232 and 233 operate based on the voltage that is applied from the internal high-voltage supply line INT_VPP_LINE and/or the internal negative-voltage supply line INT_VBB_LINE. The internal circuit 231 operates based on the high voltage VPP and the negative voltage VBB. The internal circuit 231 uses a great voltage level difference between a pull-up voltage and a pull-down voltage. For example, an e-fuse circuit including an e-fuse uses a great voltage level difference during a program operation or a rupture operation. The internal circuit 232 operates based on the high voltage VPP and the ground voltage VSS. An example of the internal circuit 232 is a word line driving circuit that drives a word line in a memory device. The internal circuit 233 operates based on the power supply voltage VDD, e.g., approximately 1.2V, and the negative voltage VBB. An example of the internal circuit 233 is a circuit for supplying a back bias voltage to a cell array in a memory device.

The pumping circuit 241 generates the high voltage VPP that is higher than the power supply voltage VDD by pumping the power supply voltage VDD. The pumping circuit 241 operates in a duration when the first control signal TM_EXPAD1 is disabled, i.e., a duration when the high voltage VPP is not applied from the outside of the integrated circuit chip. The pumping circuit 242 generates the negative voltage VBB that is lower than the ground voltage VSS by pumping the ground voltage VSS. The pumping circuit 242 operates in a duration when the second control signal TM_EXPAD2 is disabled, i.e., a duration when the negative voltage VBB is not applied from the outside of the integrated circuit chip.

Hereinafter, the test operation and the normal operation of the integrated circuit chip are described.

Test Operation

During a test operation, the first control signal TM_EXPAD1 and the second control signal TM_EXPAD2 are enabled, and the high voltage VPP is applied to the first NC pad NC_PAD1, for example, through test equipment, and the negative voltage VBB is applied to the second NC pad NC_PAD2, for example, through the test equipment. The pumping circuits 241 and 242 are disabled. The levels of the voltages that are applied to the first NC pad NC_PAD1 and the second NC pad NC_PAD2 are controlled by the test equipment, and the test equipment freely controls the voltages or operates the internal circuits 231, 232 and 233 while stably maintaining the voltage levels of the voltages. Through the operation, whether there is a defect in the internal circuits 231, 232 and 233 and the characteristics of the internal circuits 231, 232 and 233 may be easily figured out, regardless of the pumping circuits 241 and 242.

Normal Operation

The first control signal TM_EXPAD1 and the second control signal TM_EXPAD2 are disabled during a normal operation. Therefore, both of the first switch S1 and the second switch S2 are turned off. Since the first switch S1 and the second switch S2 are all turned off, even though the first NC pad NC_PAD1 and the second NC pad NC_PAD2 are coupled with the ground voltage VSS terminal or the power supply voltage VDD terminal, power source noise entering the first NC pad NC_PAD1 and the second NC pad NC_PAD2 may be cut off. The pumping circuits 241 and 242 provide the internal high-voltage supply line INT_VPP_LINE and the internal negative-voltage supply line INT_VBB_LINE with the voltages generated by the pumping circuits 241 and 242, and the internal circuits 231, 232 and 233 operate based on the voltages generated by the pumping circuits 241 and 242.

Although FIG. 2 illustrates structures related to the first NC pad NC_PAD1 for receiving the high voltage VPP from the outside of an integrated circuit chip and structures related to the second NC pad NC_PAD2 for receiving the negative voltage VBB from the outside of an integrated circuit chip, the integrated circuit chip may include either the structures related to the first NC pad NC_PAD1 or the structures related to the second NC pad NC_PAD2. Also, if the internal circuits 231, 232 and 233 are used for a test operation, or the internal circuits 231, 232 and 233 operate using the high voltage VPP and the negative voltage VBB during a test operation and operate using the power source voltage VDD and the ground voltage VSS during a normal operation, the pumping circuits 241 and 242 may be omitted from the integrated circuit chip.

Figure 3:
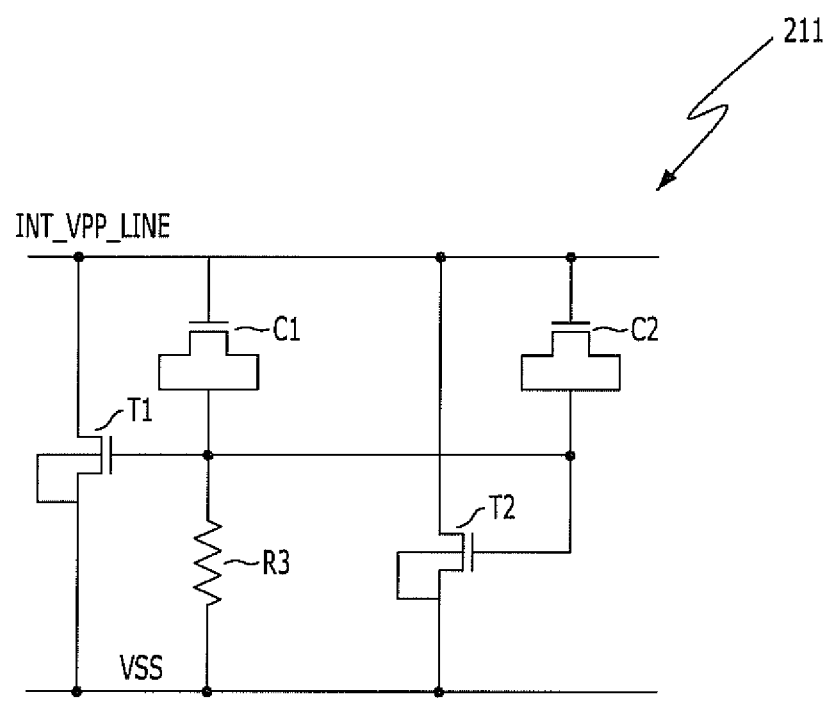
FIG. 3 is a circuit diagram of an electrostatic discharge (ESD) protection circuit shown in FIG. 2.

FIG. 3 is a circuit diagram of the electrostatic discharge (ESD) protection circuit 211 shown in FIG. 2.

Referring to FIG. 3, the ESD protection circuit 211 includes capacitors C1 and C2, a resistor R3, and transistors T1 and T2.

To have a look at the operations of the constituent elements, the capacitors C1 and C2 maintain the voltages of both ends at a uniform level, and when the voltage of the internal high-voltage supply line INT_VPP_LINE is stable, the transistors T1 and T2 maintain an off state. Thus, no current flows from the internal high-voltage supply line INT_VPP_LINE to the ground voltage VSS terminal.

However, when the voltage of the internal high-voltage supply line INT_VPP_LINE increases excessively high, the level of voltage applied to the gates of the transistors T1 and T2 surges momentarily to turn on the transistors T1 and T2. Thus, current flows from the internal high-voltage supply line INT_VPP_LINE to the ground voltage VSS terminal.

The ESD protection circuit 212 is disposed between the ground voltage VSS terminal and the internal negative-voltage supply line INT_VBB_LINE. The clamp circuit 221 may be designed similar to the ESD protection circuit 211 illustrated in FIG. 3, except that the clamp circuit 221 is disposed between the internal high-voltage supply line INT_VPP_LINE and the internal negative-voltage supply line INT_VBB_LINE.

According to an exemplary embodiment of the present invention, a high voltage or a negative voltage is applied through an NC pad. Therefore, the level of pumping voltage used by an internal circuit of an integrated circuit chip may be easily changed.

Also, since the electrical connection between the NC pad and a voltage supply line is controlled by a switch, malfunction may be prevented even though the NC pad is coupled with a power supply voltage terminal or a ground voltage terminal during the operation of the integrated circuit chip.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
    an internal power line;
    a no-connection (NC) pad;
    a switch configured to electrically connect the internal power line with the NC pad to supply a first external voltage to the internal power line through the NC pad in response to a control signal; and
    a voltage pumping circuit configured to supply a pumping voltage to the internal power line by pumping a second external voltage when the control signal is disabled,
    wherein the control signal is enabled while the integrated circuit performs a test operation,
    wherein the second external voltage includes a power supply voltage and a ground voltage supplied to the integrated circuit for a normal operation.

2. The integrated circuit of claim 1, further comprising:
    a resistor between the switch and the NC pad.

3. The integrated circuit of claim 1, further comprising:
    an electrostatic discharge (ESD) protection circuit coupled between the internal power line and a ground voltage terminal.

4. The integrated circuit of claim 1, wherein the switch includes a MOS transistor, and a voltage of the internal power line is supplied to a bulk of the MOS transistor.

5. The integrated circuit of claim 1, wherein the first external voltage includes a high voltage higher than the power supply voltage and a negative voltage lower than the ground voltage.

6. An integrated circuit, comprising:
    an internal high-voltage supply line;
    an internal negative-voltage supply line;
    a first no-connection (NC) pad;
    a second NC pad;
    a first switch configured to electrically connect the internal high-voltage supply line with the first NC pad in response to a first control signal; and
    a second switch configured to electrically connect the internal negative-voltage supply line with the second NC pad in response to a second control signal,
    wherein the first and second control signals are enabled in a test operation.

7. The integrated circuit of claim 6, wherein the first control signal is enabled to supply a high voltage to the internal high-voltage supply line through the first NC pad while the integrated circuit performs the test operation, and
    the second control signal is enabled to supply a negative voltage to the internal negative-voltage supply line through the second NC pad while the integrated circuit performs the test operation.

8. The integrated circuit of claim 6, further comprising:
    a first electrostatic discharge (ESD) protection circuit configured to electrically connect the internal high-voltage supply line and a ground voltage terminal;
    a second ESD protection circuit configured to electrically connect the internal negative-voltage supply line and the ground voltage terminal; and
    a voltage clamp circuit configured to electrically connect the internal high-voltage supply line and the internal negative-voltage supply line.

9. The integrated circuit of claim 6, wherein the first switch includes a PMOS transistor and a voltage of the internal high-voltage supply line is applied to a bulk of the PMOS transistor, and
    the second switch includes an NMOS transistor and a voltage of the internal negative-voltage supply line is applied to a bulk of the NMOS transistor.

10. The integrated circuit of claim 7, further comprising:
    a high-voltage pumping circuit configured to supply the high voltage to the internal high-voltage supply line by pumping a power supply voltage when the first control signal is disabled; and
    a negative-voltage pumping circuit to supply the negative voltage to the internal negative-voltage supply line by pumping a ground voltage when the second control signal is disabled.

* * * * *